United States Patent
Lee et al.

(10) Patent No.: US 10,714,451 B2
(45) Date of Patent: Jul. 14, 2020

(54) TILING STRUCTURE TYPE LIGHT APPARATUS FOR ORGANIC LIGHT EMITTING DEVICE

(71) Applicant: LG DISPLAY CO., LTD., Seoul (KR)

(72) Inventors: Shinbok Lee, Seoul (KR); Hwankeon Lee, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 17 days.

(21) Appl. No.: 16/168,215

(22) Filed: Oct. 23, 2018

(65) Prior Publication Data

US 2019/0164932 A1 May 30, 2019

(30) Foreign Application Priority Data

Nov. 29, 2017 (KR) .................. 10-2017-0161335

(51) Int. Cl.
*F21V 21/00* (2006.01)
*H01L 25/04* (2014.01)
*F21V 8/00* (2006.01)
*H01L 51/52* (2006.01)
*H01L 27/32* (2006.01)

(52) U.S. Cl.
CPC ............ *H01L 25/048* (2013.01); *G02B 6/009* (2013.01); *G02B 6/0051* (2013.01); *G02B 6/0053* (2013.01); *G02B 6/0055* (2013.01); *G02B 6/0091* (2013.01); *H01L 27/3293* (2013.01); *H01L 51/5203* (2013.01); *H01L 51/5237* (2013.01); *H01L 51/5262* (2013.01);
(Continued)

(58) Field of Classification Search
CPC ............... H01L 25/048; H01L 27/3293; H01L 51/5203; H01L 51/5237; H01L 52/5262; H01L 2251/5338; H01L 2251/5361; G02B 6/0051; G02B 6/0053; G02B 6/0055; G02B 6/009; G02B 6/0091
USPC ...... 362/249.03, 249.04, 355, 646, 647, 238
See application file for complete search history.

(56) References Cited

U.S. PATENT DOCUMENTS

| 5,801,797 A | * | 9/1998 | Iida | .................... G02F 1/13336 |
| | | | | 349/139 |
| 9,614,022 B2 | * | 4/2017 | Miyake | ............... H01L 27/3293 |

(Continued)

FOREIGN PATENT DOCUMENTS

| KR | 10-20006-0072737 A | 6/2006 |
| KR | 20-0434173 Y1 | 12/2006 |
| KR | 10-2013-0024027 A | 3/2013 |

*Primary Examiner* — Laura K Tso
(74) *Attorney, Agent, or Firm* — Birch, Stewart, Kolasch & Birch, LLP

(57) ABSTRACT

An OLED lighting apparatus of a tiling structure in a seamless structure without a bezel area is discussed. The OLED lighting apparatus includes a first flexible OLED panel and a second flexible OLED panel. The first flexible OLED panel which a bezel area and one side of a light emitting area are bent, and the second flexible OLED panel which a bezel area is bent, are fastened by a fastening member, and a light guide plate and an optical member are arranged on the fastening member. As a result, the OLED lighting apparatus tiles by using the fastening member at a boundary portion to which the first and second flexible OLED panels contact, and the light guide plate and the optical member are applied on the fastening member, so that a light can be emitted even at the boundary portion to which first and second flexible OLED panels contact.

11 Claims, 6 Drawing Sheets

(52) U.S. Cl.
CPC .............. *H01L 2251/5338* (2013.01); *H01L 2251/5361* (2013.01)

(56) References Cited

U.S. PATENT DOCUMENTS

| | | | |
|---|---|---|---|
| 10,133,531 B2* | 11/2018 | Yoshitani | ................ G06F 3/044 |
| 10,332,859 B2* | 6/2019 | Nakamura | .......... H01L 27/3267 |
| 2013/0049567 A1 | 2/2013 | Kim et al. | |
| 2016/0014882 A1* | 1/2016 | Jongman | ............. G02F 1/13452 |
| | | | 361/749 |
| 2018/0182840 A1* | 6/2018 | Lin | ..................... H01L 27/3293 |
| 2019/0305073 A1* | 10/2019 | Chen | ................... H01L 51/0097 |

\* cited by examiner

TILING STRUCTURE TYPE LIGHT APPARATUS FOR ORGANIC LIGHT EMITTING DEVICE

CROSS-REFERENCE TO RELATED APPLICATION

This application claims priority to and the benefit of Korean Patent Application No. 10-2017-0161335, filed on Nov. 29, 2017, the disclosure of which is incorporated herein by reference in its entirety.

BACKGROUND

1. Field of the Invention

The present invention relates to an organic light emitting diode (OLED) lighting apparatus, and more particularly, to an OLED lighting apparatus of a tiling structure.

2. Description of Related Art

Currently, fluorescent lamps and incandescent lamps are mainly used as a lighting apparatus. The incandescent lamps have a problem of very low energy efficiency, despite high color rendering index, and the fluorescent lamps have a problem of low color rendering index and contain mercury causing environmental pollution, despite good energy efficiency.

Accordingly, light emitting diodes (LEDs) have been proposed as a lighting apparatus capable of replacing fluorescent lamps or incandescent lamps. Such a light emitting diode is formed of an inorganic light emitting material, and light emitting efficiency thereof has a maximum value in the blue wavelength band and decreases toward the red wavelength band and the green wavelength band, which has the highest visibility. Accordingly, a method of obtaining white light by combining a red LED with a green LED and a blue LED has a problem of reduction in light emitting efficiency. Such a method also has a problem of reduction in color rendering properties due to a small width of an emission peak of each LED.

In order to overcome such problems, there has been proposed a lighting apparatus configured to emit white light through a combination of a blue LED with yellow phosphors instead of combining a red LED with a green LED and a blue LED. This is because a method of obtaining white light through the combination of a blue LED having a high light emitting efficiency with the fluorescent materials that emit yellow light when irradiated with blue light from the blue LED is more efficient than using a green LED, which has low light emitting efficiency.

However, such a lighting apparatus configured to emit white light through the combination of the blue LED with the yellow phosphors has a limited light emitting efficiency due to the low light emitting efficiency of the yellow fluorescent materials.

In order to solve such a problem of reduction in luminous efficiency, there has been proposed an OLED lighting apparatus using an organic light emitting apparatus formed of an organic light emitting material. Generally, an organic light emitting apparatus has a relatively good light emitting efficiency in the green and red wavelength regions, as compared with an inorganic light emitting apparatus. In addition, such an organic light emitting apparatus exhibits improved color rendering properties due to a relatively wide emission peak in the blue, red, and green wavelength regions, as compared with an inorganic light emitting apparatus, and thus can emit light similar to sunlight.

SUMMARY OF THE INVENTION

An object of the present invention is to provide an OLED lighting apparatus of a tiling structure of a seamless structure without a bezel area.

To this end, in accordance with an exemplary embodiment of the present invention, the OLED lighting apparatus of the tiling structure includes a first flexible OLED panel and a second flexible OLED panel. The first flexible OLED panel, in which a bezel area and one side of a light emitting area are bent, and the second flexible OLED panel, in which a bezel area is bent, are fastened by a fastening member, and a light guide panel and an optical member are arranged on the fastening member.

As a result, in accordance with an exemplary embodiment of the present invention, the OLED lighting apparatus of the tiling structure tiles the first and second flexible OLED panels at a boundary portion to which the first and second flexible OLED panels contact by using the fastening member. In addition, a light can be emitted even at the boundary portion to which the first and second flexible OLED panels contact by applying the light guide plate and the optical member on the fastening member.

Therefore, in accordance with an exemplary embodiment of the present invention, the OLED lighting apparatus of the tiling structure has the seamless structure without the bezel area, and thus, there is no concern that a visible characteristic is lowered.

In accordance with an exemplary embodiment of the present invention, an OLED lighting apparatus includes a first flexible OLED panel in which a bezel area and a part of a light emitting area are bent, a second flexible OLED panel in which a bezel area arranged adjacent to the bezel area of the first flexible PLED panel is bent, a fastening member to couple the first and second flexible OLED panels, and a light guide plate which is arranged on the fastening member and guides a light emitted from a bent side of the first flexible OLED panel upwardly.

At this time, the fastening member has a first fixing clip to fix the first flexible OLED panel, a second fixing clip to fix the second flexible OLED panel, and an electrode connecting portion to electrically connect the first and second flexible OLED panels.

As a result, in accordance with an exemplary embodiment of the present invention, an OLED lighting apparatus in a tiling structure includes a first flexible OLED panel and a second flexible OLED panel. The first flexible OLED panel, in which a bezel area and one side of the light emitting area are bent, and the second flexible OLED panel, in which the bezel area is bent, are fastened by a fastening member. Further, a light guide plate and an optical member are arranged on the fastening member, and thus a light emitted from the bent light emitting area of the first flexible OLED panel can be guided upwardly by the light guide plate and the optical member.

Accordingly, in accordance with an exemplary embodiment of the present invention, the OLED lighting apparatus of the tiling structure is configured to emit even the bezel area inevitably arranged at a boundary portion to which the first flexible OLED panel and the second flexible OLED panel contact. As a result, it has a seamless structure without a bezel area.

In addition, in accordance with an exemplary embodiment of the present invention, the OLED lighting apparatus of the tiling structure tiles the first and second flexible OLED panels to a boundary portion to which the first and second flexible OLED panels contact by using the fastening member. In addition, the light guide plate and the optical member are applied on the fastening member so that the light is emitted even at the boundary portion to which the first and second flexible OLED panels contact. Accordingly, since it has a seamless structure without the bezel area, there is no concern that the visual characteristic will be inhibited.

In accordance with an exemplary embodiment of the present invention, an OLED lighting apparatus includes a first flexible OLED panel and a second flexible OLED panel. The first flexible OLED panel in which a bezel area and one side of a light emitting area are bent, and the second flexible OLED panel in which a bezel area is bent, are fastened by a fastening member. In addition, a light guide plate and an optical member are arranged on the fastening member, so that a light emitted from a bent light emitting area of the first flexible OLED panel can be guided upwardly by the light guide plate and the optical member.

Accordingly, in accordance with an exemplary embodiment of the present invention, an OLED lighting apparatus of a tiling structure is configured to be able to emit even a bezel area inevitably arranged at a boundary portion to which a first flexible OLED panel and a second flexible OLED panel contact. Thus, it has a seamless structure without a bezel area.

In addition, in accordance with an exemplary embodiment of the present invention, the OLED lighting apparatus of the tiling structure tiles the first and second flexible OLED panels at the boundary portion to which the first and second flexible OLED panels contact by using a fastening member. In addition, a light guide plate and an optical member are applied on the fastening member, so that a light can be emitted even at the boundary portion to which the first and second flexible OLED panels contact. Accordingly, since it has a seamless structure without a bezel area, there is no concern that a visual characteristic will be inhibited.

DETAILED DESCRIPTION OF THE EMBODIMENTS

Figure 1:
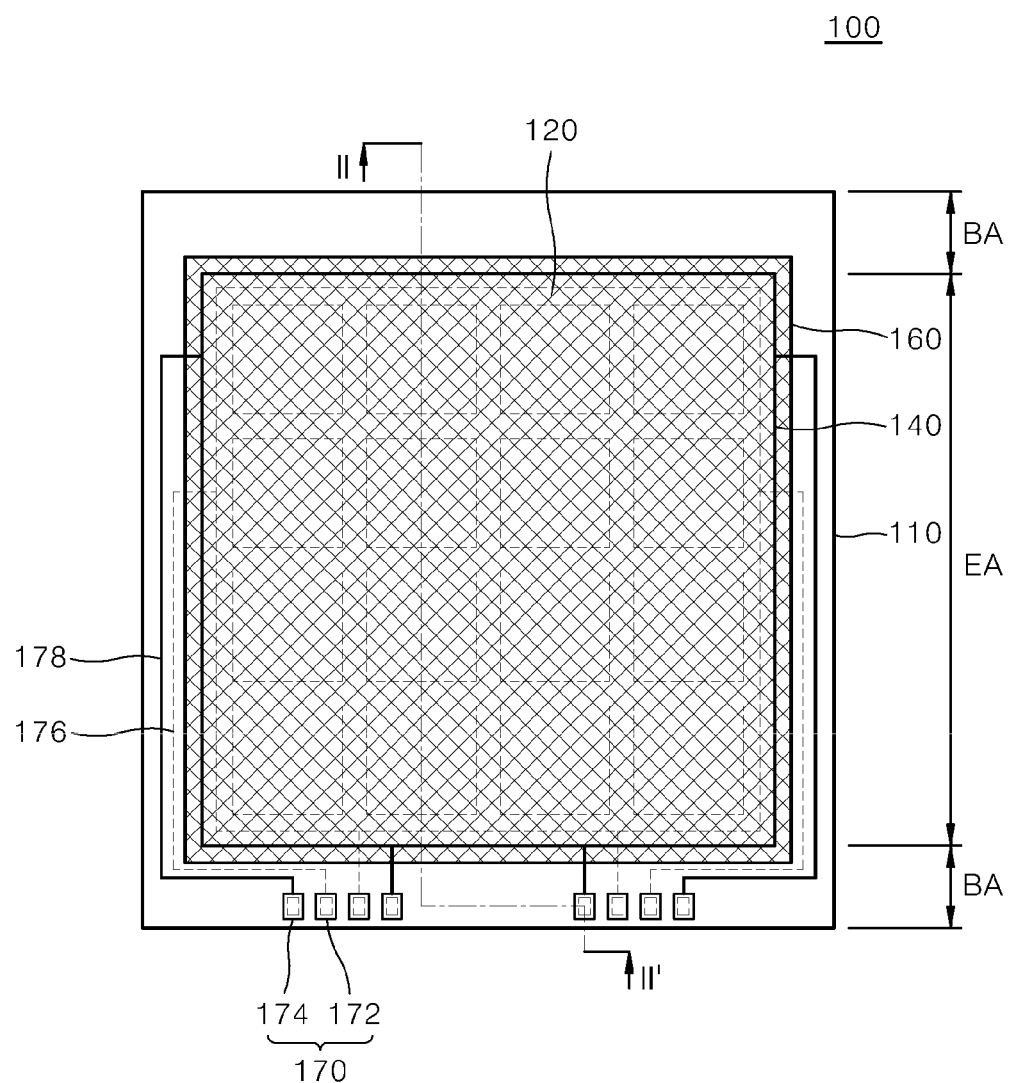
FIG. 1 is a plan view showing a flexible OLED panel applied to an OLED lighting apparatus of a tiling structure in accordance with an exemplary embodiment of the present invention.

Hereinafter, the above-mentioned objects, the features, and the advantages of the present invention will be described in detail with reference to the accompanying drawings. Accordingly, those skilled in the art will perform the technical idea of the present invention easily. In describing the present invention, When it is determined that the detailed description of known techniques associated with the present invention may obscure the gist of the present invention, the detailed description thereof will be omitted. Hereinafter, the preferred embodiments of the present invention will be described in detail with reference to the accompanying drawings. The same reference numerals are used to indicate the same or similar components in the drawings.

Hereinafter, an OLED lighting apparatus of a tiling structure in accordance with embodiments of the present invention will be described in detail with reference to the accompanying drawings.

Figure 2:
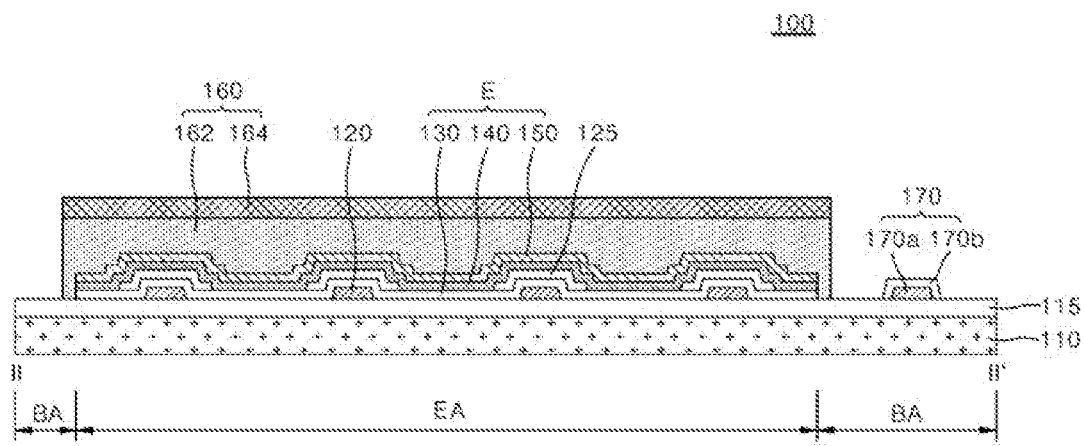
FIG. 2 is a cross-sectional view taken along line II-II' of FIG. 1.

FIG. 1 is a plan view showing a flexible OLED panel applied to an OLED lighting apparatus of a tiling structure in accordance with a first embodiment of the present invention, and FIG. 2 is a cross-sectional view taken along line II-II' of FIG. 1. All the components of the OLED lighting apparatus according to all embodiments of the present invention are operatively coupled and configured.

Referring to FIGS. 1 and 2, in accordance with the first embodiment of the present invention, a flexible OLED panel 100 applied to the OLED lighting apparatus of the tiling structure includes a buffer layer 115 arranged on a substrate 110 and an organic light emitting apparatus E on the buffer layer 115.

The substrate 110 can have a light emitting area (EA) to emit a light and a bezel area (BA) which does not emit a light. At this time, the bezel area (BA) can be arranged on at least one side of the substrate 110. That is, the bezel area (BA) can be arranged on an upper side and a lower side, respectively, or arranged only on an upper side or a lower side. In addition, the bezel area BA can be arranged on four sides of the substrate, respectively.

The organic light emitting apparatus (E) includes a first electrode 130 arranged on the buffer layer 115, an organic light emitting layer 140 arranged on the upper part of the first electrode 130, and a second electrode 150 arranged on the organic light emitting layer 140. In a flexible OLED panel 100 having such a structure, the organic light emitting layer 140 emits a light as a signal is applied to the first electrode 130 and the second electrode 150 of the organic light emitting apparatus E, a light is emitted throughout the substrate 110.

At this time, an auxiliary wire 120 is arranged in a matrix form on the substrate 110. The auxiliary wire 120 is formed of a metal having good conductivity to allow a uniform voltage to be applied to the first electrode 130 arranged over the entire area of the substrate 110, so that a light emitting can be performed with a uniform brightness in the flexible OLED panel 100. This auxiliary wire 120 is arranged between the buffer layer 150 and the first electrode 130 and can be connected in a form directly contacting to the first electrode 130.

The first electrode 130 is formed of a transparent conductive material, such as ITO, and advantageously transmits the emitted light therethrough. However, the first electrode 130 has a drawback of much higher electrical resistance than metals. As a result, when the flexible OLED panel 100 is manufactured, a distribution of a current applied to a wide light emitting area EA is not uniform due to a high resistance of the transparent conductive material. Such non-uniform current distribution makes the light emitting of the uniform brightness of the flexible OLED panel 100 impossible.

The auxiliary electrode 120 can be arranged in the form of a matrix, mesh, hexagon, octagon, and circle having a small width over the entire substrate 110. Accordingly, the uniform voltage can be applied to the first electrode 130 on the entire substrate 110, allowing the light emitting of the uniform brightness in the flexible OLED panel 100.

At this time, although the auxiliary wire 120 is arranged on a lower part of the first electrode 130 and the auxiliary electrode 120 can be arranged on an upper part of the first electrode 130. This auxiliary wire 120 can be formed of an alloy material selected from at least one or two of Al, Au, Cu, Ti, W, Mo, and Cr. This auxiliary wiring 120 can have a single layer structure or a multilayer having two or more layers.

The substrate 110 can be divided into a plurality of unit pixels by the auxiliary wire 120 arranged in the matrix form. Since the auxiliary wire 120 has much lower resistance than the first electrode 130, the voltage for the first electrode 130 is applied to the first electrode 130 through the auxiliary wire 120 rather than being directly applied to the first electrode 130 via a first pad 172. In this way, the first electrode 130 formed over the entire substrate 110 can be divided into the plurality of pixels by the auxiliary wire 120.

Although this auxiliary wire 120 can have a width of approximately 30 to 70 μm, which is merely illustrative, it can be determined by various factors such as the kinds of the used metal, an area of the flexible OLED panel 100, and a size of the pixel.

In addition, a pad 170, to which the first electrode 130 and a second electrode 150 are connected respectively and a voltage is applied from the outside, is arranged on the substrate 110. For this purpose, the pad 170 can include a first pad 172 connected to the first electrode 130 and a second pad 174 connected to the second electrode 150. The first pad 172 and the second pad 174 can be electrically connected to the first electrode 130 and the second electrode 150 through a first connection wire 176 and the second connection wire 178, respectively.

Although the pad 170 is shown as arranged at the bezel area BA of an edge of one side of the substrate 110 in FIG. 1, it is merely illustrative and a position and the number thereof can be varied in various forms. That is, the pad 170 can be arranged on the bezel area BA of an edge of both sides of the substrate 110, respectively, or arranged on the bezel BA of the edges of four sides of the substrate 110, respectively.

Here, the pad 170 can include a pad electrode 170a arranged on the same layer as the auxiliary wires 120 and formed of the same material as the auxiliary wires 120 and a pad electrode terminal 170b stacked on the pad electrode 170a and formed of the same material as the first electrode 130.

A protective layer 125 is stacked on an upper part of the first electrode 130. The protective layer 125 is arranged on the upper part of the first electrode 130 to cover the auxiliary wire 120.

Since the auxiliary wires 120 are formed of an opaque metal, the light is not emitted from regions in which the auxiliary wire 120 is formed. Accordingly, on the first electrode 130, the protective layer 125 is only provided on the upper part on which the auxiliary wire 120 is disposed and the protective layer 125 is not provided on a position on which the auxiliary wire 120 is not arranged, the light is emitted and output only in a light emitting portion.

In addition, the protective layer 125 can be formed to surround the auxiliary wire 120 to reduce a surface coverage caused by the auxiliary wire 120 such that the subsequently stacked organic light emitting layer 140 and the second electrode 150 can be stably stacked without a disconnection.

For this purpose, the protective layer 125 can be formed of an inorganic material, such as SiOx or SiNx. Alternatively, the protective layer 125 can be formed of an organic material, such as photoacryl, or can be formed as a plurality of layers including an inorganic layer and an organic layer.

The organic light emitting layer 140 and the second electrode 150 are sequentially arranged on the upper part of the first electrode 130 and the protective layer 125.

The organic light emitting layer 140 can be formed of an organic light emitting material that emits a white light. For example, the organic light emitting layer 140 can include a blue organic light emitting layer, a red organic light emitting layer, and a green organic light emitting layer. Alternatively, the organic light emitting layer 140 can have a tandem structure including a blue light emitting layer and a yellow-green light emitting layer. However, it should be understood that the present invention is not limited thereto and the organic light emitting layer 140 can be configured in various ways.

In addition, the organic light emitting apparatus E can further include an electron injection layer and a hole injection layer which inject an electron and a hole into the organic light emitting layer 140, respectively; an electron transport layer and a hole transport layer which transport injected electron and hole to the organic light emitting layer; and a charge generation layer which generates a charge such as an electron and a hole.

The organic light emitting layer 140 can be formed of a material that receives the hole and the electron from the hole transport layer and the electron transport layer, respectively, and combines them in order to emit the light in a visible region. A material having good quantum efficiency for fluorescence or phosphorescence is preferred. Examples of the organic material can include an 8-hydroxyquinoline aluminum complex (Alq3), a carbazole compound, a dimerized styryl compound, BAlq, a 10-hydroxybenzoquinoline-metal compound, benzoxazole, benzthiazole, and benzimidazole compounds, and poly(p-phenylene vinylene) (PPV), and are not limited thereto.

The second electrode 150 can be formed of a metal, such as Ca, Ba, Mg, Al, or Ag, or the alloy thereof. Here, the second pad 174, to which the second electrode 150 is connected and applies a voltage to the second electrode 150, in a non-active area NAA of the substrate 110.

By including the first electrode 130, the organic light emitting layer 140, and the second electrode 150 is referred to as an organic light emitting apparatus E. Here, the first electrode 130 is an anode of the organic light emitting apparatus E and the second electrode 150 is a cathode of the organic light emitting apparatus E. When voltage is applied between the first electrode 130 and the second electrode 150, electrons and holes are injected into the organic light emitting layer 140 from the second electrode 150 and the first electrode 130, respectively, thereby generating excitons in the organic light emitting layer 140. As the excitons decay, light corresponding to energy difference between a lowest unoccupied molecular orbital (LUMO) and a highest occupied molecular orbital (HOMO) of the organic light emitting layer 140 is generated and emitted toward the substrate 110.

An encapsulation layer 160 covering the second electrode 150 of the organic light emitting apparatus E is arranged in the light emitting area EA on the substrate 110 having the organic light emitting apparatus E formed thereon.

The encapsulation layer 160 can include an adhesive layer 162 and a base layer 164 arranged on the adhesive layer 162. In this way, the encapsulation layer 160 including the adhesive layer 162 and the base layer 164 is arranged in the light emitting area EA of the substrate 110 having the organic light emitting apparatus E thereon such that the flexible OLED panel 100 can be sealed by the base layer 164 attached to the adhesive layer 162.

Here, a photocurable adhesive or a heat-curable adhesive can be used as an adhesive layer 162. The base layer 164 is arranged to prevent moisture or air from the outside from being penetrated and any material is possible as a base layer as long as the base layer serves to this function. For example, the base layer 164 can be formed of a polymeric material, such as polyethylene terephthalate (PET), or a metallic material, such as an aluminum foil, an Fe—Ni alloy, or an Fe—Ni—Co alloy.

In accordance with the first embodiment of the present invention, since the flexible OLED panel applied to the OLED lighting apparatus of a tiling method having the above-mentioned configuration uses the organic light emitting apparatus formed of an organic light emitting material, it has relatively good light emitting efficiency in the green and red wavelength regions, as compared with an inorganic light emitting apparatus, and exhibits improved color rendering properties due to relatively wide emission peak in the blue, red, and green wavelength regions, thereby emitting light similar to sunlight.

Recently, in order to realize a large-area lighting and various types of flexible lightings, a large-area tiled OLED lighting apparatus of a tiling structure has been manufactured by tiling a plurality of flexible OLED panels having the above-described configuration.

Figure 3:
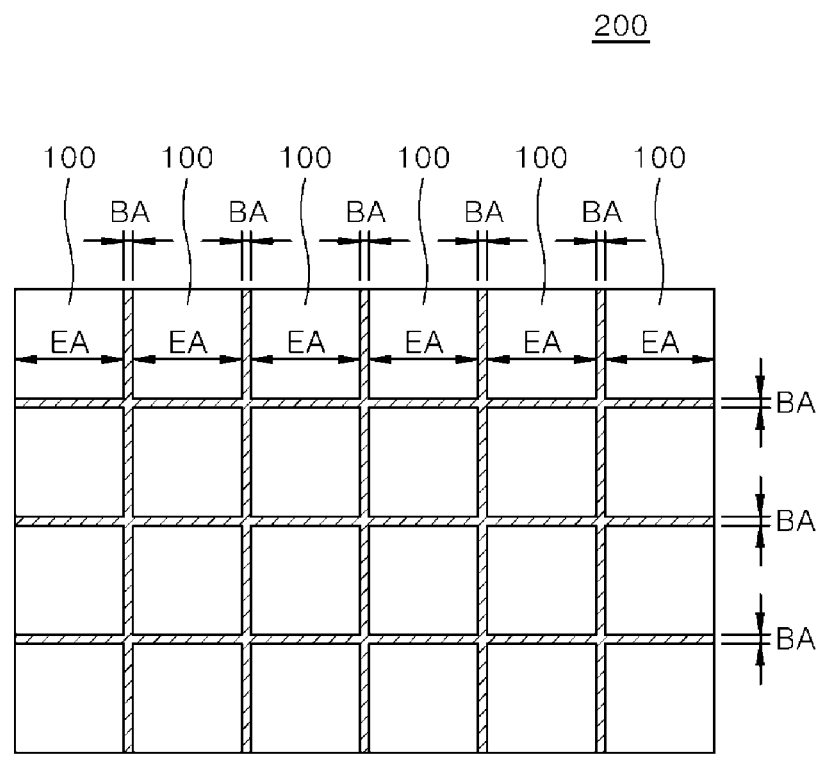
FIG. 3 is a plan view showing an OLED lighting apparatus of a tiling structure in accordance with a first embodiment of the present invention.

FIG. 3 is a plan view of an OLED lighting apparatus of a tiling structure in accordance with the a first embodiment of the present invention, and the OLED lighting apparatus of a tiling structure in accordance with the first embodiment of the present invention will be described in more detail with reference to FIG. 3.

As shown in FIG. 3, in accordance with the first embodiment of the present invention, an OLED lighting apparatus 200 of a tiling structure is manufactured using a method of tiling at least two flexible OLED panels 100, and subsequently mounting it on a frame. At this time, the flexible OLED panel 100 that is same as or substantially the same as that described in FIGS. 1 and 2 can be used.

In order to realize a large-area lighting, it is advantageous to manufacture a plurality of flexible OLED panels 100 by tiling. However, when the plurality of flexible OLED panels 100 are tiled, the bezel area BA has to be inevitably arranged at a boundary portion to which the plurality of flexible OLED panels 100 contact. Since such a bezel area BA is arranged in the matrix form in a central portion of the OLED lighting apparatus 200 of a tiling structure, it can be a factor for hindering the visual characteristic.

In order to address it, in accordance with a second embodiment of the present invention, the OLED lighting apparatus of the tiling structure includes a first flexible OLED panel and a second flexible OLED panel. The first flexible OLED panel in which the bezel area and one side of the light emitting area are bent, and the second flexible OLED panel in which the bezel area is bent, are fastened by a fastening member, and a light guide plate and an optical member are arranged on the fastening member.

As a result, in accordance with the second embodiment of the present invention, the OLED lighting apparatus of the tiling structure tiles the first and second flexible OLED panels by using the fastening member at the boundary portion to which the first and second flexible OLED panels contact. In addition, the light guide plate and the optical member are applied on the fastening member on the fastening member so that the light is emitted even at the boundary portion to which the first and second flexible OLED panels contact. Thereby, since it has the seamless structure without the bezel area, there is no concern that the visual characteristic will be inhibited.

An example of this configuration will now be described in more detail with reference to the accompanying drawings.

Figure 4:
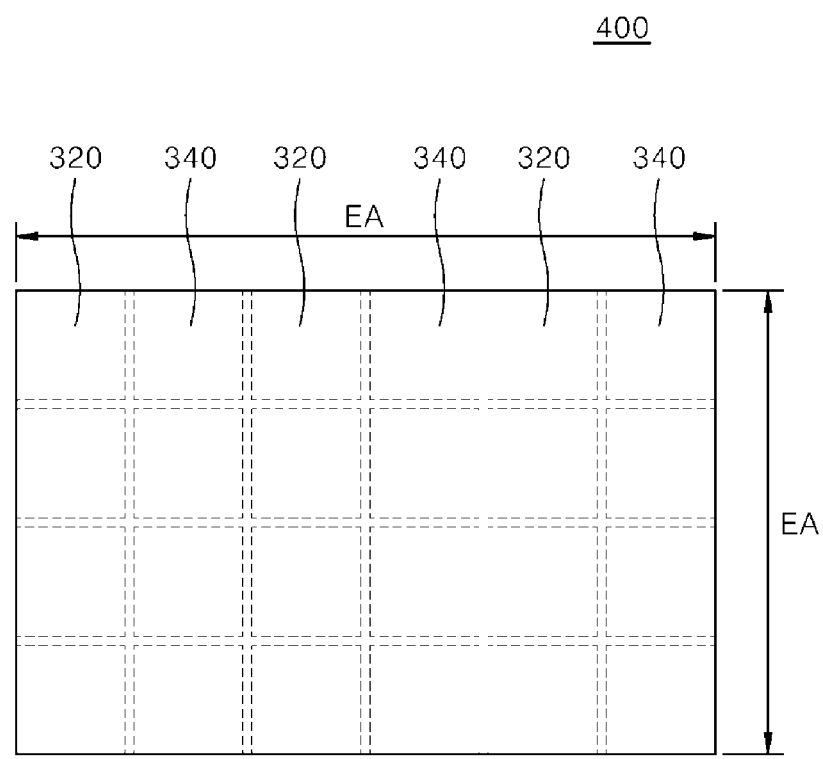
FIG. 4 is a plan view showing an OLED lighting apparatus of a tiling structure in accordance with a second embodiment of the present invention.
Figure 5:
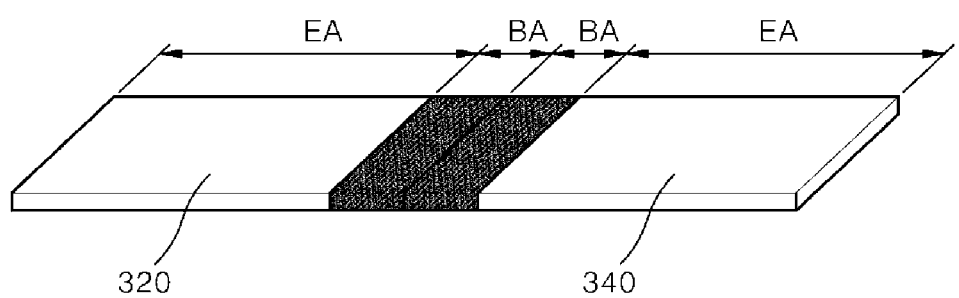
FIG. 5 is a perspective view showing a state before coupling the first and second flexible OLED panels in accordance with the a second embodiment of the present invention.
Figure 6:
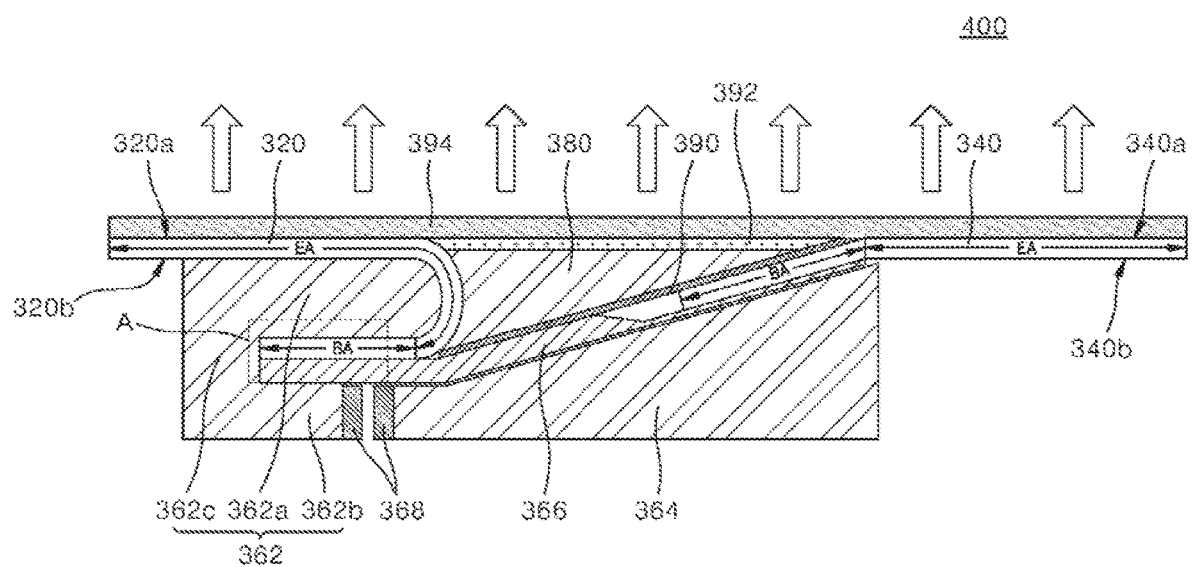
FIG. 6 is a cross-sectional view showing a state in which the first and second flexible OLED panels in accordance with the second embodiment of the present invention are coupled with a fastening member.

FIG. 4 is a plan view showing an OLED lighting apparatus of a tiling structure in accordance with the second embodiment of the present invention, and FIG. 5 is a perspective view showing a state before coupling the first and second flexible OLED panels in accordance with second embodiment of the present invention, and FIG. 6 is a cross-sectional view showing a state in which the first and second flexible OLED panels in accordance with the second embodiment of the present invention are coupled by a fastening member.

As shown in FIGS. 4 to 6, in accordance with the second exemplary embodiment of the present invention, an OLED lighting apparatus 400 of a tiling structure includes a first flexible OLED panel 320 and a second flexible OLED panel 340. The first flexible OLED panel 320 in which a bezel area BA and one side of a light emitting area EA are bent, and the second flexible OLED panel 340 in which a bezel area BA is bent, are fastened by a fastening member 360, and a light guide plate 380 and an optical member 392 are arranged on the fastening member 360 so that a light emitted from a bent light emitting area EA of the first flexible OLED panel 320 is guided upwardly by the light guide plate 380 and the optimal member 392.

Accordingly, in accordance with the second embodiment of the present invention, the LED lighting apparatus 400 of the tiling structure is structured to emit light even in the bezel area BA which is inevitably arranged at the boundary portion to which the first flexible OLED panel 320 and the second flexible OLED panel 340 contact. Accordingly, it has a seamless structure without a bezel area.

In other words, in accordance with the second embodiment of the present invention, the OLED lighting apparatus 400 of the tiling structure tiles the first and second flexible OLED panels by using the fastening member 360 at the boundary portion to which the first and second flexible OLED panels 320, 340 contact. In addition, the light guide plate 380 and the optical member 392 are applied on the fastening member 360 such that the light is emitted even in the boundary portion to which the first and second flexible OLED panels 320, 340 contact. Thereby, since it has substantially the identical structure as the seamless structure without the bezel area, there is no concern that the visual characteristic is inhibited.

To this end, in accordance with the second embodiment of the present invention, the OLED lighting apparatus 400 of the tiling structure includes the first flexible OLED panel 320, the second flexible OLED panel 340, the fastening member 360, and the light guide plate 380.

As shown in FIG. 6, the first flexible OLED panel 320 has a first surface 320a and a second surface 320b opposite to the first surface 320*a*, and includes the light emitting area EA to emit a light and the bezel area BA which is connected to the light emitting area EA and arranged on at least one side.

As described above, the bezel area BA of the first flexible OLED panel 320 can be arranged at an edge of at least one side of the substrate. That is, the bezel area BA of the first flexible OLED panel 320 can be arranged on an edge of an upper side and a lower side of a substrate respectively, or arranged only an edge of an upper side or a lower side. In addition, the bezel area BA can be arranged on four edges of the substrate, respectively.

In particular, the first flexible OLED panel 320 has the bezel area and the light emitting area EA in which a part thereof is bent. As such, the part of the first flexible OLED panel 320 is bent and the light emitting area EA of the bent portion of the first flexible OLED panel 320 is arranged on a side, thereby emitting a light laterally. The substantially same panel as the flexible OLED panel 100 which is shown and explained in FIGS. 1 and 2 can be used, as a first flexible OLED panel 320.

The second flexible OLED panel 340 has a first surface 340*a* and a second surface 340*b* opposite to the first surface 340*a*, and includes a light emitting area EA to emit a light and a bezel area BA connected to the light emitting area EA and arranged on at least one side. The bezel area BA of the second flexible OLED panel 340, which is arranged adjacent to the bezel area BA of the first flexible OLED panel 320 is bent.

As such, the bezel area BA of the second flexible OLED panel 340 can be arranged at an edge of at least one side of the substrate. That is, the bezel area of the second flexible OLED panel 340 can be arranged on the upper and lower edges of the substrate, respectively, or only on the upper or lower edge. In addition, the bezel area BA of the second flexible OLED panel 340 can be arranged at the edges of the four sides of the substrate, respectively.

The substantially same panel as the flexible OLED panel which is shown and explained in FIGS. 1 and 2 can be used, as a second flexible OLED panel 340.

The fastening member 360 couples the first and second flexible OLED panels 320 and 340.

This fastening member 360 has a first fixing clip 362, a second fixing clip 364, and an electrode connecting portion 366. Further, the fastening member 360 can further include a magnetic unit 368.

The first fixing clip 362 fixes the first flexible OLED panel 320. To this end, the first fixing clip 362 has a first supporting portion 362*a* to support a second surface 320*b* of the first flexible OLED panel 320 which the bezel area BA and a part of the light emitting area EA are bent, a second supporting portion 362*b* to support a lower surface of the connection terminal portion 366 and a side connecting portion 362*c* to connect the first and second supporting portions 362*a* and 362*b*.

The second fixing clip 364 fixes the second flexible OLED panel 340. To this end, the second fixing clip 364 supports the second surface 340*b* of the second flexible OLED panel 340 which the bezel area BA is bent and the electrode connecting portion 366, and a part thereof is arranged to be overlapped with the first flexible OLED panel 320. At this time, the second fixing clip 364 can have a diagonal line surface whose width is lowered as it goes from a portion which contacts to the second surface 340*b* of the second flexible OLED panel 340 to the second supporting portion 362*b* of the first fixing clip 362.

The electrode connecting portion 366 electrically connects the first and second flexible OLED panels 320 and 340. To this end, the electrode connecting portion 366 is mounted on the first fixing clip 362 and the second fixing clip 364. Accordingly, one end of the electrode connecting portion 366 is seated on the second supporting portion 362*b* of the first fixing clip 362 and arranged to face the bezel area BA of the first flexible OLED panel 320. In addition, the other end of the electrode connecting portion 366 is seated on the second fixing clip 364 and arranged to face the bezel area BA of the second flexible OLED panel 340.

Figure 7:
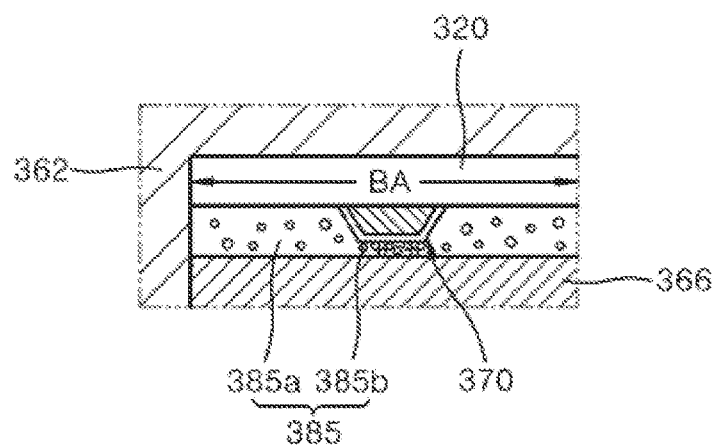
FIG. 7 is an enlarged cross-sectional view showing a portion A in FIG. 6.

FIG. 7 is an enlarged cross-sectional view showing portion A of FIG. 6, and the portion A will be described in more detail with reference to FIG. 7.

As shown in FIGS. 6 and 7, the first flexible OLED panel 320 has a first terminal 370 arranged in the bezel area BA and the second flexible OLED panel 340 has a second terminal arranged on a bezel area BA. At this time, an electrode connecting portion 366 is electrically connected to the first terminal 370 and the second terminal via a conductive film 385, respectively.

In FIG. 7, although the electrode connecting portion 366 is shown using the conductive film 385 as a connection means for the first terminal 370 and the second terminal, it is merely illustrative, and an electrical connection can be formed in various ways, other than the above method. For example, a connecting can be performed by directly linking the electrode connecting portion 360, the first terminal 370, and the second terminal by a mechanical compression, or a soldering can be performed in a state in which a solder is arranged to be inserted between the electrode connecting portion 366 and the first terminal 370, and the electrode connecting portion 366 and the second terminal to perform a connection electrically.

In this case, since polymeric resin material is used as the substrate material inevitably, in order for the first and second flexible OLED panels of the present invention to exert a flexible feature, it is more preferable to perform a low temperature soldering of approximately 300° C. or less. In addition, it will be a known fact that a known method capable of electrically connecting the electrode connecting portion 366 and the first terminal 366, and the electrode connecting portion 366 and the second terminal can be applied in various ways.

The conductive film 385 can include an insulating resin layer 385*a* and a conductive particle 385*b* randomly dispersed and arranged in the insulating resin layer 385*a*. At this time, the conductive film 385 is attached to the bezel areas BA of the first flexible OLED panel 320 and the second flexible OLED panel 340, respectively. In addition, the conductive particle 385*b* dispersed and arranged in the insulating resin layer 385*a* of the conductive film 385 are selectively compressed by the selective thermal compression of the conductive film 385. Thus, only the first electrode 370 and the second electrode and the electrode connecting portion 366, which the conductive particle 385*b* of the conductive film 385 is arranged on a selectively compressed portion, can form a selectively electrical connection.

Accordingly, the first and second flexible OLED panels 320 and 340 can be electrically connected by the electrode connecting portion 360. Here, the first and second flexible OLED panels 320 and 340 can be electrically connected by a parallel connection structure by the electrode connecting portion 366. In addition, the first and second flexible OLED panels 320 and 340 can be electrically connected by a series connection structure by the electrode connecting portion 366.

Referring to FIGS. 4 to 6 again, the magnetic unit 368 attaches the first fixing clip 362 and the second fixing clip 364. To this end, the magnetic unit 368 can include a first magnetic unit which is attached to a side wall of one side of the first fixing clip 362 and has a first polarity and a second magnetic unit which is attached to a side wall of other side of the second fixing clip 364 facing to the first fixing clip 362 and having a second polarity different from the first polarity. As such, the first and second fixing clips 362 and 362 can be attached stably by the magnetic unit 368 having the first magnetic unit having the first polarity and the second magnetic unit having the second polarity.

The light guide plate 380 is arranged on the fastening member 360 and guides the light emitted from the bent side of the first flexible OLED panel 320 upwardly.

To this end, it is preferably that the light guide plate 380 is arranged on the bezel areas BA of the second flexible OLED panel 340 and the fastening member 360. Such light guide plate 380 allows the light emitted from the bent light emitting area EA of the first flexible OLED panel 320 to be evenly spread to a wide area of the light guide plate 380 as it proceeds in the light guide plate 380 by a total reflection, thereby providing a surface light source to the optical member 392 arranged on its upper side direction.

In addition, in accordance with a second embodiment of the present invention, the OLED lighting apparatus 400 of the tiling structure can further include a reflection plate 390, an optical member 392, and a light extraction layer 394.

The reflection plate 390 is arranged between the light guide plate 380 and the fastening member 360. The reflection plate 390 reflects a scattered light of the light emitted from the curved light emitting area EA of the first flexible OLED panel 320 again toward the optical member 392 so as to improve a brightness of light.

The optical member 392 is arranged on the light guide plate 380. At this time, the optical member 392 refracts or scatters the light which is emitted from the curved light emitting area EA of the first flexible OLED panel 320 and is guided upward by the light guide plate 380 in order to increase a viewing angle and increase a brightness.

The optical member 392 can include at least two of a diffuser sheet, a prism sheet, a protection sheet, and a double brightness enhance file (DBEF).

The diffuser sheet diffuses a light emitted from a curved light emitting area EA of the first flexible OLED panel 320 and is guided upwardly by a light guide plate 380 along a surface in order to serve to make a color and a brightness uniform throughout the screen of an OLED lighting device 400 of a tiling structure.

The prism sheet is stacked on a diffuser sheet and serves to refract or condense a light diffused by the diffuser sheet to increase a brightness.

The protective sheet is stacked on a prism sheet and serves to protect a diffuser sheet and a prism sheet from an external impact or an inflow of a foreign material. Further, the protective sheet is mounted for the purpose of preventing a scratch from being generated on the prism sheet.

The double brightness enhance file is mounted to improve a brightness. Such double brightness enhance file is a type of a polarizing film and is referred to as a reflective polarizing film. The double brightness enhance file transmits the polarized light in a direction parallel to the polarization direction of the double brightness enhance file of the light emitted from a bent light emitting area EA of a first flexible OLED panel 320 and reflects the polarized light in the direction different from the polarization direction of the double brightness enhance file, so that a brightness is improved.

The light extracting layer 394 is arranged on the optical member 392 and the light emitting area EA of the first and second flexible OLED panels 320, 340. At this time, in the light extracting layer 394, a film formed as an integral or a separate type can be used.

This light extracting layer 394 is attached on the optical member 392 and the light emitting area EA of the first and second flexible OLED panels 320 and 340. The light extracting layer 394, together with the light emitting area EA of the first and second flexible OLED panels 320, 340 serves to increase a light extracting efficiency of the light which is emitted from the curved light emitting area EA of the first flexible OLED panel 320 and is guided upwardly by the light guide plate 380.

In accordance with the second embodiment of the present invention, the OLED lighting apparatus of the tiling structure includes the first flexible OLED panel and the second flexible OLED panel. The first flexible OLED panel which the bezel area and a part of the light emitting area are bent, and the second flexible OLED panel, which the bezel area is bent, are fastened by the fastening member. Further, the light guide plate and the optical member are arranged on the fastening member, so that the light emitted from the bent light emitting area of the first flexible OLED panel can be guided upwardly by the light guide plate and the optical member.

Accordingly, in accordance with the second embodiment of the present invention, the OLED lighting apparatus of the tiling structure is designed to emit the light even in a bezel area inevitably arranged at the boundary portion to which the first flexible OLED panel and the second flexible OLED panel contact. Thus, it has the seamless structure without the bezel area.

In other words, in accordance with the second embodiment of the present invention, the OLED lighting apparatus of the tiling structure tiles the first and second flexible OLED panels at the boundary portion to which the first and second flexible OLED panels contact using a fastening member. In addition, the light guide plate and the optical member are applied on the fastening member so that the light is emitted even at the boundary portion to which the first and second flexible OLED panels contact. Thereby, since it has the substantially identical structure as the seamless structure without the bezel area, there is no concern that the visual characteristic is inhibited.

Figure 8:
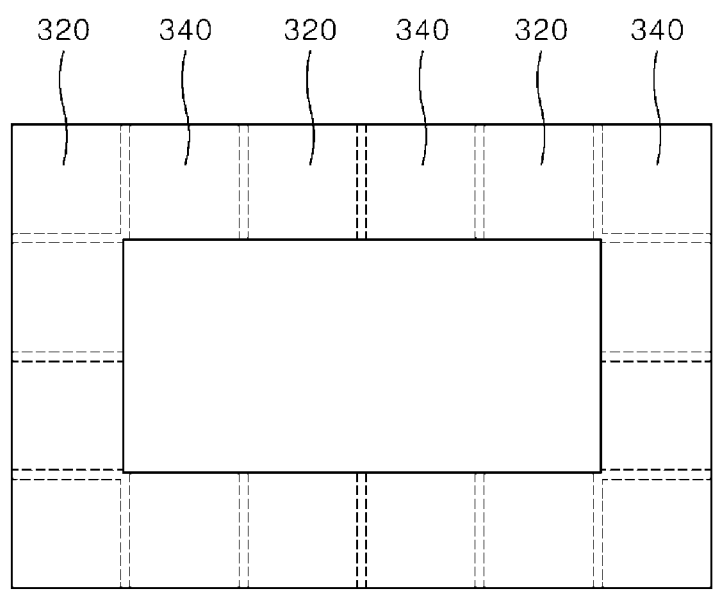
FIG. 8 is a plan view showing an OLED lighting apparatus of a tiling structure in accordance with a third embodiment of the present invention.

Meanwhile, FIG. 8 is a plan view showing an OLED lighting apparatus of a tiling structure in accordance with a third embodiment of the present invention. At this time, in accordance with the third embodiment of the present invention, the OLED lighting apparatus of the tiling structure is substantially the same as the OLED lighting apparatus in accordance with the second embodiment except the applied structure of a tiling, and a redundant description will be omitted/brief and only the differences will be mainly described.

As shown in FIG. 8, in accordance with the third embodiment of the present invention, in an OLED lighting apparatus 400 of a tiling structure, a plurality of first and second flexible OLED panels 320, 340 are coupled by using a fastening member 360 (in FIG. 6) and can be arranged so as to have a square frame shape by tiling.

As described above, in accordance with the third embodiment of the present invention, the OLED lighting apparatus 400 of the tiling structure tiles by coupling the plurality of first and second flexible OLED panels 320, 340 along an edge by using a fastening member, and the first and second flexible OLED panels 320, 340 are not arranged in an inner center portion.

Accordingly, in accordance with the a third embodiment of the present invention, the plurality of first and second flexible OLED panels 320, 340 are tiled by a square frame shape by the fastening member, and thus, it has a structural advantage of maximizing an aesthetic effect.

Figure 9:
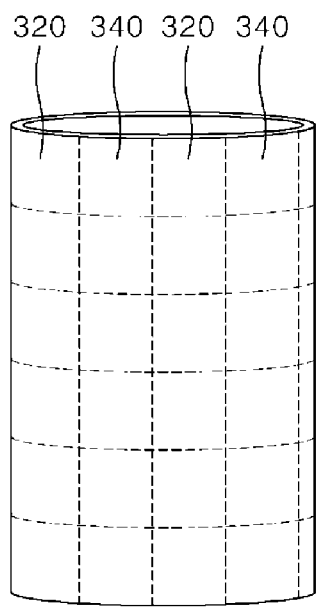
FIG. 9 is a perspective view showing an OLED lighting apparatus of a tiling structure in accordance with a fourth embodiment of the present invention.

In addition, FIG. 9 is a perspective view showing an OLED lighting apparatus of a tiling structure in accordance with a fourth embodiment of the present invention. At this time, the OLED lighting apparatus of the tiling structure in accordance with the fourth embodiment of the present invention is substantially the same as the second embodiment except for the structure of application of the tiling, and a redundant description will be omitted/brief, and only the differences will be mainly described.

As shown in FIG. 9, in accordance with the fourth embodiment of the present invention, in the OLED lighting apparatus 400 of the tiling structure, the plurality of first and second flexible OLED panels 320, 340 can be coupled by using a fastening member 360 (in FIG. 6) and can be arranged by tiling so as to have a cylindrical form.

As described above, in accordance with the fourth embodiment of the present invention, the plurality of first and second flexible OLED panels 320, 340 can be coupled by using the fastening member and tiled in a cylindrical shape, and thus, the OLED lighting apparatus 400 can be installed in a building structure in a cylindrical shape, or any applicable environment in which the curved display device can be used. At this time, it can be a clear fact that it can be tiled in various shapes other than the square frame shape and the cylindrical shape shown in FIGS. 8 and 9.

While the present invention has been mainly described with reference to the exemplary embodiments thereof, various changes or modifications can be made at a level of those skilled in the art. It is therefore to be understood that such changes and modifications are intended to be included within the scope of the present invention unless the scope of the invention does not depart from the scope of the present invention.

What is claimed is:

1. An organic light emitting diode (OLED) lighting apparatus of a tiling structure, comprising:
   a first flexible OLED panel in which a bezel area and a part of a light emitting area are bent;
   a second flexible OLED panel in which a bezel area arranged adjacent to the bezel area of the first flexible OLED panel is bent;
   a fastening member to couple the first and second flexible OLED panels; and
   a light guide plate which is arranged on the fastening member and guides a light which is emitted from a bent side of the first flexible OLED panel upward.

2. The OLED lighting apparatus of the tiling structure of claim 1, wherein each of the first and second flexible OLED panels comprises:
   the light emitting area to emit the light, and
   the bezel area which is connected to the light emitting area and arranged on at least one side.

3. The OLED lighting apparatus of the tiling structure of claim 1, wherein the light guide plate is arranged on the fastening member and the bezel area of the second flexible OLED panel.

4. The OLED lighting apparatus of the tiling structure of claim 1, wherein the fastening member comprises:
   a first fixing clip to fix the first flexible OLED panel;
   a second fixing clip to fix the second flexible OLED panel; and
   an electrode connecting portion to electrically connect the first and second flexible OLED panels.

5. The OLED lighting apparatus of the tiling structure of claim 4, wherein the first flexible OLED panel has a first terminal arranged in the bezel area of the first flexible OLED panel and the second flexible OLED panel has a second terminal arranged in the bezel area of the second flexible OLED panel.

6. The OLED lighting apparatus of the tiling structure of claim 5, wherein the electrode connecting portion is electrically connected to the first terminal and the second terminal, respectively, via a conductive film.

7. The OLED lighting apparatus of the tiling structure of claim 4, wherein the first fixing clip has:
   a first supporting portion to support a second surface of the first flexible OLED panel in which the bezel area of the first OLED panel and a part of the light emitting area are bent;
   a second supporting portion to support a lower surface of the connecting terminal portion; and
   a side connecting portion to connect the first and second supporting portions.

8. The OLED lighting apparatus of the tiling structure of claim 4, wherein the second fixing clip supports a second side of the second flexible OLED panel in which the bezel area of the second flexible OLED panel is bent and the electrode connecting portion, and a part thereof is arranged to be overlapped with the first flexible OLED panel.

9. The OLED lighting apparatus of the tiling structure of claim 4, wherein the fastening member further comprises a magnetic unit to attach the first fixing clip and the second fixing clip.

10. The OLED lighting apparatus of the tiling structure of claim 1, wherein a plurality of the first and second flexible OLED panels are coupled by a least one of the fastening member and are tiled in any one form among a lattice shape, a square frame shape, and a cylindrical shape.

11. The OLED lighting apparatus of the tiling structure of claim 1, wherein the OLED lighting apparatus further comprises:
   a reflection plate arranged between the light guide plate and the fastening member;
   an optical member arranged on the light guide plate; and
   a light extracting layer arranged on the light emitting area of the first and second flexible OLED panels and the optical member.

* * * * *